(12) United States Patent
Matsuda

(10) Patent No.: US 10,348,316 B2
(45) Date of Patent: Jul. 9, 2019

(54) FREQUENCY DIVISION CORRECTION CIRCUIT, RECEPTION CIRCUIT, AND INTEGRATED CIRCUIT

(71) Applicant: SOCIONEXT INC., Yokohama-shi, Kanagawa (JP)

(72) Inventor: Atsushi Matsuda, Yokohama (JP)

(73) Assignee: SOCIONEXT INC., Yokohama (JP)

(*) Notice: Subject to any disclaimer, the term of this patent is extended or adjusted under 35 U.S.C. 154(b) by 18 days.

(21) Appl. No.: 15/656,716

(22) Filed: Jul. 21, 2017

(65) Prior Publication Data
US 2018/0034469 A1 Feb. 1, 2018

(30) Foreign Application Priority Data
Jul. 27, 2016 (JP) .................. 2016-147482

(51) Int. Cl.
*H03K 23/00* (2006.01)
*H03L 7/18* (2006.01)
*H03K 7/08* (2006.01)
*H03L 7/08* (2006.01)
*H03K 5/156* (2006.01)
*H03K 23/48* (2006.01)
*H03L 7/089* (2006.01)
*H04L 7/033* (2006.01)

(52) U.S. Cl.
CPC .......... *H03L 7/18* (2013.01); *H03K 5/1565* (2013.01); *H03K 7/08* (2013.01); *H03K 23/486* (2013.01); *H03L 7/0807* (2013.01); *H03L 7/0891* (2013.01); *H04L 7/0331* (2013.01)

(58) Field of Classification Search
CPC . H03L 7/18; H03L 7/08; H03L 7/0807; H03L 7/0891; H03L 7/0331

USPC ........................................ 327/115
See application file for complete search history.

(56) References Cited

U.S. PATENT DOCUMENTS

| 5,365,119 A * | 11/1994 | Kivari | H03K 5/00006 327/115 |
| 7,042,257 B2 * | 5/2006 | Wang | H03C 3/0925 327/115 |
| 8,406,371 B1 * | 3/2013 | Barale | H03K 23/662 377/47 |
| 9,214,943 B1 * | 12/2015 | Gupta | H03K 23/68 |
| 9,543,960 B1 * | 1/2017 | He | H03K 21/10 |

(Continued)

FOREIGN PATENT DOCUMENTS

JP 2004-056717 A 2/2004
JP 2006-268617 A 10/2006

OTHER PUBLICATIONS

Extended European Search Report of related European Patent Application No. 17182552.4 dated Jan. 4, 2018.

*Primary Examiner* — Ryan Jager
(74) *Attorney, Agent, or Firm* — Arent Fox LLP

(57) ABSTRACT

A frequency division correction circuit includes: a first frequency divider configured to perform decimal frequency division on an input signal and output a first frequency division signal and a second frequency division signal which are different from each other in duty ratio; and a corrector configured to generate a first output signal having an intermediate duty ratio between a duty ratio of the first frequency division signal and a duty ratio of the second frequency division signal on the basis of the first frequency division signal and the second frequency division signal.

17 Claims, 8 Drawing Sheets

(56) References Cited

U.S. PATENT DOCUMENTS

| | | | |
|---|---|---|---|
| 2003/0034810 A1* | 2/2003 | Trivedi | H03K 23/68 327/115 |
| 2011/0234266 A1* | 9/2011 | Tsai | G06F 1/08 327/115 |
| 2013/0002319 A1* | 1/2013 | Yeo | H03K 23/52 327/157 |
| 2014/0079177 A1 | 3/2014 | Li | |
| 2014/0211897 A1* | 7/2014 | Kim | G06F 1/04 375/362 |
| 2018/0019753 A1* | 1/2018 | Jung | H03K 19/20 |

* cited by examiner

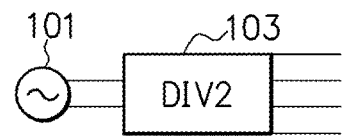
F I G. 1A
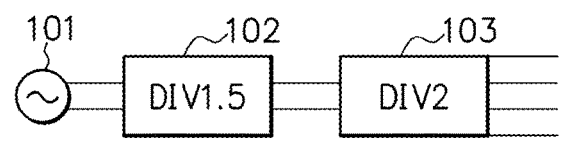
F I G. 1B
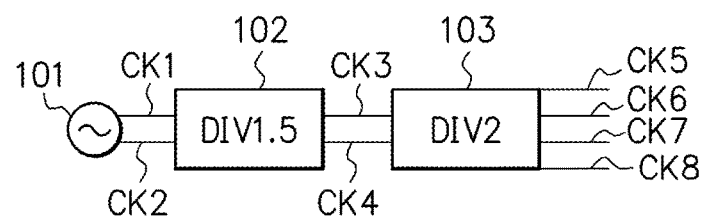
F I G. 2A
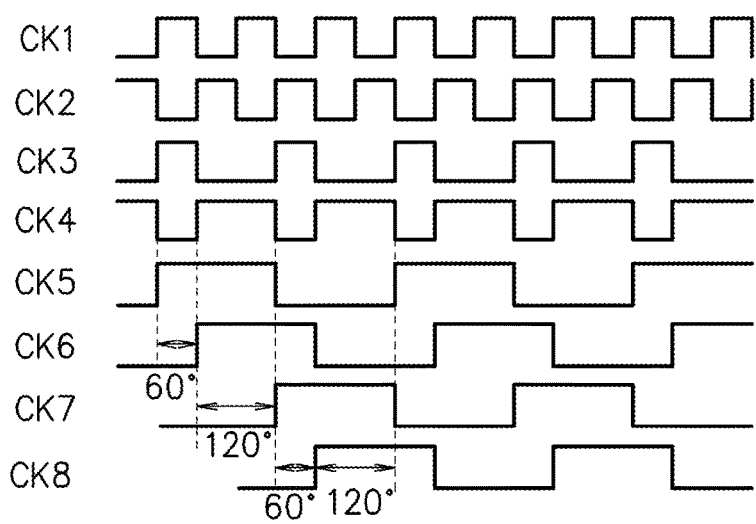
F I G. 2B

F I G. 6A
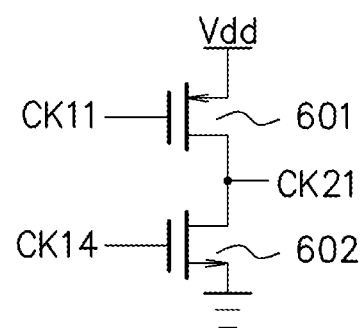
F I G. 6B
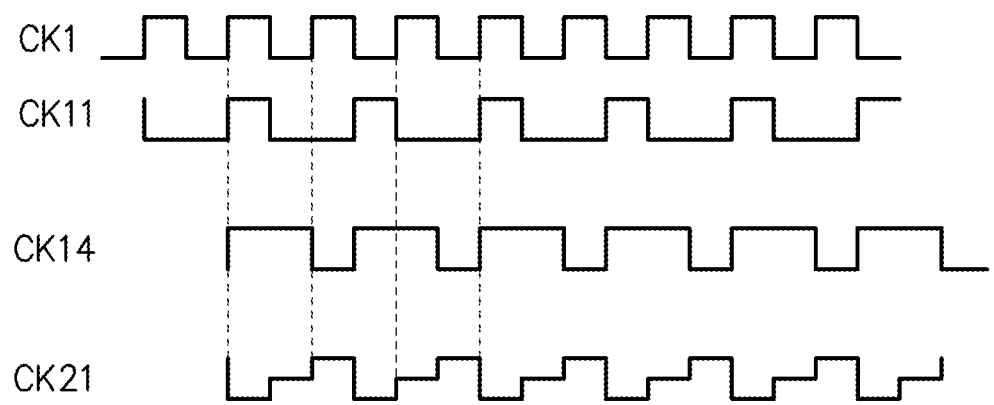

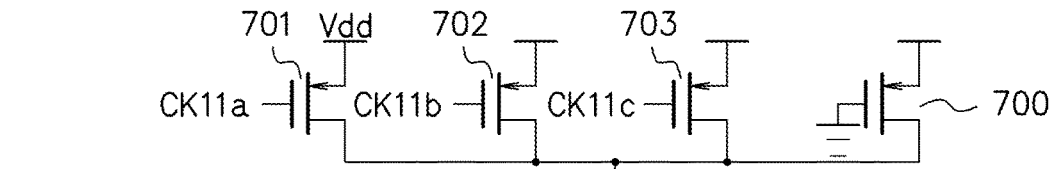
F I G. 9A
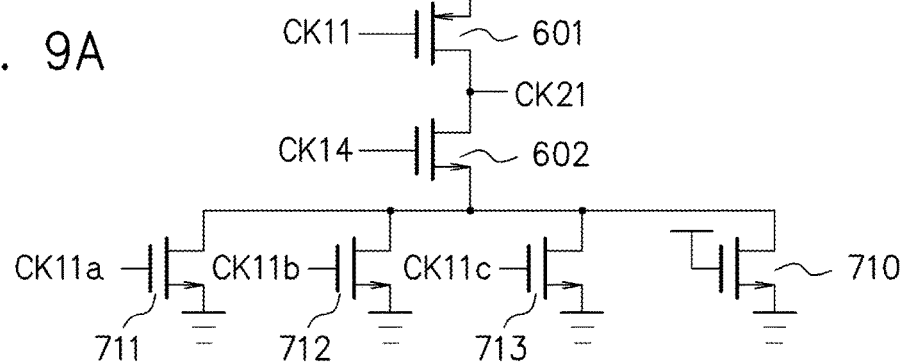
F I G. 9B
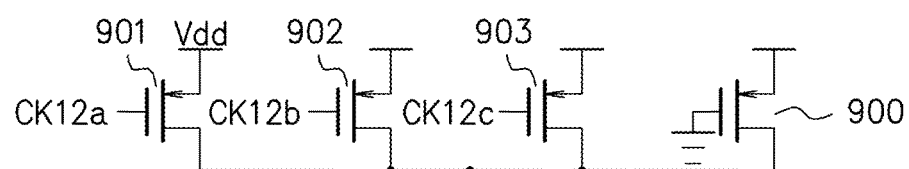
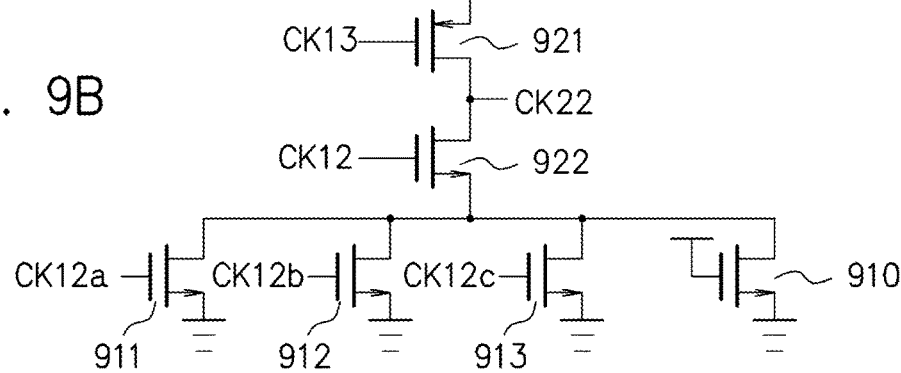
F I G. 9C
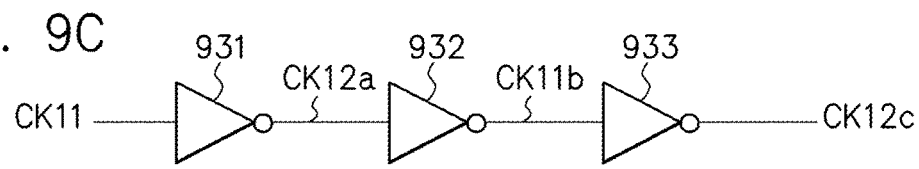
F I G. 9D
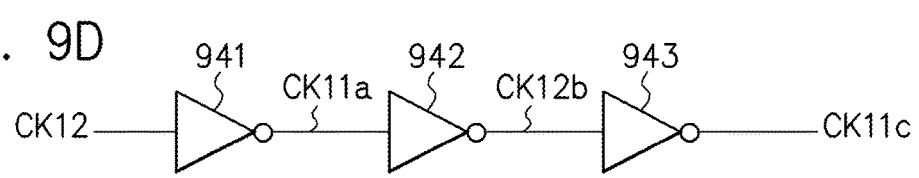

US 10,348,316 B2

FREQUENCY DIVISION CORRECTION CIRCUIT, RECEPTION CIRCUIT, AND INTEGRATED CIRCUIT

CROSS-REFERENCE TO RELATED APPLICATION

This application is based upon and claims the benefit of priority of the prior Japanese Patent Application No. 2016-147482, filed on Jul. 27, 2016, the entire contents of which are incorporated herein by reference.

FIELD

The embodiments discussed herein are directed to a frequency division correction circuit, a reception circuit, and an integrated circuit.

BACKGROUND

A semiconductor device including a PLL circuit having a built-in VCO, a plurality of frequency dividing circuits, and a selection circuit is known (refer to Patent Document 1). The plurality of frequency dividing circuits output a plurality of 1/N-frequency division clock signals based on the output frequency of the PLL circuit, and one of them can output a frequency division output after the decimal point. The selection circuit selects one of the frequency division outputs outputted from the plurality of frequency dividing circuits by mode setting, and outputs the clock signal of a selected frequency division ratio.

Besides, a clock generating circuit that frequency-divides an input clock based on frequency division ratio data is known (refer to Patent Document 2). The clock generating circuit includes a frequency division ratio identifier that identifies the frequency division ratio data as an even number, an odd number, or a decimal number, and also includes a delay device and a frequency divider. The delay device includes the number (M), corresponding to M=9×p+(p−1), of delay taps so as to change the delay amount in multiple stages, while including a tap selection unit that controls the delay amount by selecting at least one of the plurality of delay taps. Note that p represents the number of digits after decimal point in the frequency division ratio data composed of a decimal number. When the frequency division ratio identifier identifies the frequency division ratio data as a decimal number, the delay device delays the input clock to generate a delay clock, and the frequency divider frequency-divides the input clock using a rise and a fall of the edge of the delay clock and using a rise and a fall of the edge of the input clock.

[Patent Document 1] Japanese Laid-open Patent Publication No. 2004-056717

[Patent Document 2] Japanese Laid-open Patent Publication No. 2006-268617

However, Patent Document 1 is for generating a divide-by-1.5 divided output signal based on four-phase clocks.

SUMMARY

A frequency division correction circuit includes: a first frequency divider configured to perform decimal frequency division on an input signal and output a first frequency division signal and a second frequency division signal which are different from each other in duty ratio; and a corrector configured to generate a first output signal having an intermediate duty ratio between a duty ratio of the first frequency division signal and a duty ratio of the second frequency division signal on the basis of the first frequency division signal and the second frequency division signal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1A and FIG. 1B are diagrams illustrating configuration examples of a clock generating circuit;

FIG. 2A is a diagram illustrating a configuration example of a clock generating circuit, and FIG. 2B is a timing chart illustrating the operation of the clock generating circuit in FIG. 2A;

FIG. 6A is a diagram illustrating a first configuration example of a duty cycle corrector, and FIG. 6B is a timing chart illustrating the operation of the duty cycle corrector in FIG. 6A;

FIG. 9A to FIG. 9D are diagrams illustrating configuration examples of the duty cycle corrector according to this embodiment.

DESCRIPTION OF EMBODIMENTS

Figure 3A:
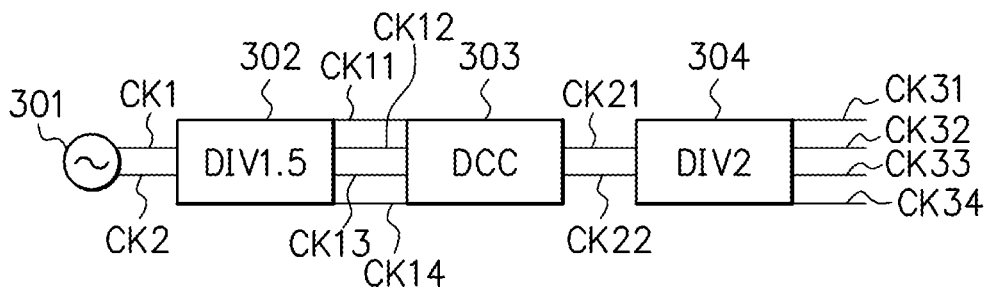
FIG. 3A is a diagram illustrating a configuration example of a frequency division correction circuit according to this embodiment.

FIG. 1A is a diagram illustrating a configuration example of a clock generating circuit using a divide-by-2 divider 103. The clock generating circuit has a voltage control oscillator (VCO) 101 and the divide-by-2 divider 103. The voltage control oscillator 101 generates, for example, clock signals each at 28 GHz by voltage control. The divide-by-2 divider 103 frequency-divides, for example, the clock signals each at 28 GHz by 2 and outputs clock signals each at 14 GHz.

FIG. 1B is a diagram illustrating a configuration example of a clock generating circuit using a divide-by-1.5 divider 102 and a divide-by-2 divider 103. The clock generating circuit has a voltage control oscillator 101, the divide-by-1.5 divider 102, and the divide-by-2 divider 103. The voltage control oscillator 101 generates, for example, clock signals each at 28 GHz by voltage control. The divide-by-1.5 divider 102 frequency-divides, for example, the clock signals each at 28 GHz by 1.5 and outputs clock signals each at 18.68 GHz. The divide-by-2 divider 103 frequency-divides, for example, the clock signals each at 18.68 GHz by 2 and outputs clock signals each at 9.33 GHz.

To cover the range of all frequencies equal to or lower than 28 GHz taken as examples, the voltage control oscillator 101 in FIG. 1B can use the divide-by-1.5 divider 102 and thereby narrow the oscillating frequency range and reduce costs as compared with the voltage control oscillator 101 in FIG. 1A. For this advantage, the divide-by-1.5 divider 102 is required.

FIG. 2A is a diagram illustrating a configuration example of a clock generating circuit, and FIG. 2B is a timing chart illustrating the operation of the clock generating circuit in FIG. 2A. The clock generating circuit has a voltage control oscillator 101, a divide-by-1.5 divider 102, and a divide-by-2 divider 103. The voltage control oscillator 101 generates two-phase clock signals (differential clock signals) CK1 and CK2 which are inverted in phase from each other. The divide-by-1.5 divider 102 frequency-divides the clock signals CK1 and CK2 by 1.5 and outputs divide-by-1.5 divided clock signals CK3 and CK4. The clock signals CK3 and CK4 are signals which are logically inverted from each other. The cycle of each of the clock signals CK3 and CK4 is one-and-a-half times the cycle of each of the clock signals CK1 and CK2. The duty ratio of the clock signal CK3 is 33.33%. The duty ratio of the clock signal CK4 is 66.67%. The divide-by-2 divider 103 frequency-divides the clock signals CK3 and CK4 by 2 to generate four-phase clock signals CK5 to CK8. The cycle of each of the clock signals CK5 to CK8 is twice the cycle of each of the clock signals CK3 and CK4.

The phase difference between the clock signals CK5 and CK6 is 60°. The phase difference between the clock signals CK6 and CK7 is 120°. The phase difference between the clock signals CK7 and CK8 is 60°. The phase difference between the clock signals CK8 and CK5 is 120°. All of the phase differences each between the four-phase clock signals CK5 to CK8 are preferably the same 90°. However, the skews of the phase differences each between the four-phase clock signals CK5 to CK8 are large, and there is an error of 30° in the skews. Hence, a frequency division correction circuit capable of generating four-phase clock signals having each of the phase differences which are the same even using a decimal frequency divider will be described below. Note that in this specification, frequency division using a number (non-integer number) expressed by using a number after the decimal point, such as 0.5 or 1.5 as a frequency division ratio is called decimal frequency division.

Figure 3B:
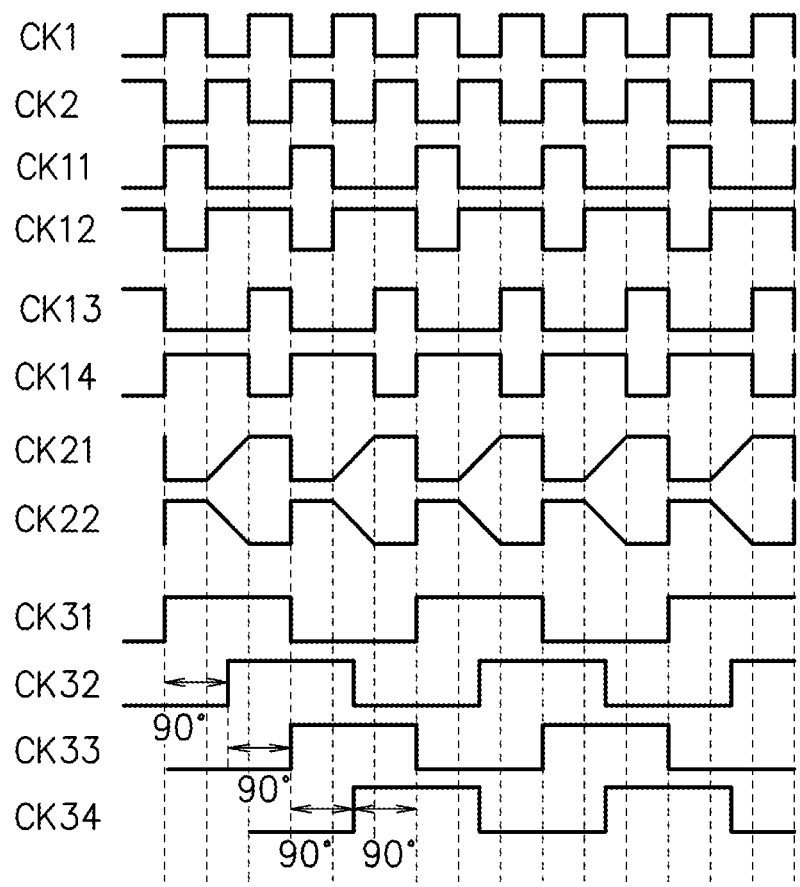
FIG. 3B is a timing chart illustrating the operation of the frequency division correction circuit in FIG. 3A.

FIG. 3A is a diagram illustrating a configuration example of a frequency division correction circuit according to this embodiment, and FIG. 3B is a timing chart illustrating the operation of the frequency division correction circuit in FIG. 3A. The frequency division correction circuit is for example, a clock generating circuit and has a voltage control oscillator 301, a divide-by-1.5 divider 302, a duty cycle corrector (DCC) 303, and a divide-by-2 divider 304. The voltage control oscillator 301 generates two-phase clock signals (differential clock signals) CK1 and CK2 which are inverted in phase from each other. The duty ratio of each of the clock signals CK1 and CK2 is 50%.

The divide-by-1.5 divider 302 is a first frequency divider and frequency-divides the clock signals CK1 and CK2 by 1.5 (decimal frequency division) and outputs divide-by-1.5 divided clock signals CK11 to CK14. The clock signal CK11 is a first frequency division signal, the clock signal CK14 is a second frequency division signal, the clock signal CK12 is a third frequency division signal, and the clock signal CK13 is a fourth frequency division signal. The clock signal CK12 is a logical inversion signal of the clock signal CK11. The clock signal CK13 is a logical inversion signal of the clock signal CK14. The cycle of each of the clock signals CK11 to CK14 is one-and-a-half times the cycle of each of the clock signals CK1 and CK2. The duty ratio of each of the clock signals CK11 and CK13 is 33.33%. The duty ratio of each of the clock signals CK12 and CK14 is 66.67%. More specifically, the divide-by-1.5 divider 302 frequency-divides the clock signals (input signals) CK1 and CK2 by 1.5 and outputs the clock signals CK11 and CK14 which are different from each other in duty ratio and clock signals CK12 and CK13 which are logically inverted from them. The details of the divide-by-1.5 divider 302 will be described later referring to FIG. 4 and FIG. 5.

The duty cycle corrector 303 corrects the duty ratios of the clock signals CK11 to CK14 to generate clock signals CK21 and CK22 having a duty ratio of 50%. Specifically, the duty cycle corrector 303 generates, based on the clock signals CK11 and CK14, the clock signal (first output signal) CK21 having an intermediate duty ratio (50%) between the duty ratio (33.33%) of the clock signal CK11 and the duty ratio (66.67%) of the clock signal CK14. The duty cycle corrector 303 also generates, based on the clock signals CK13 and CK12, the clock signal (second output signal) CK22 having an intermediate duty ratio (50%) between the duty ratio (33.33%) of the clock signal CK13 and the duty ratio (66.67%) of the clock signal CK12.

A level change time from a low level (first logic level) to a high level (second logic level) of the clock signal CK21 is longer than a level change time of each of the clock signals CK11 and CK14. The duty cycle corrector 303 generates the clock signal CK21 so that its level is changed from a low level toward a high level in the level change time longer than the level change time of each of the clock signals CK11 and CK14.

Similarly, a level change time from a high level to a low level of the clock signal CK22 is longer than a level change time of each of the clock signals CK13 and CK12. The duty cycle corrector 303 generates the clock signal CK22 so that its level is changed from a high level toward a low level in the level change time longer than the level change time of each of the clock signals CK13 and CK12. The details of the duty cycle corrector 303 will be described later.

The divide-by-2 divider 304 is a second frequency divider and frequency-divides the clock signals CK21 and CK22 by 2 (integer frequency division) to generate four-phase clock signals CK31 to CK34. The cycle of each of the clock signals CK31 to CK34 is twice the cycle of each of the clock signals CK21 and CK22. The duty ratio of each of the clock signals CK31 to CK34 is 50%. The phase difference between the clock signals CK31 and CK32 is 90°. The phase difference between the clock signals CK32 and CK33 is also 90°. The phase difference between the clock signals CK33 and CK34 is also 90°. The phase difference between the clock signals CK34 and CK31 is also 90°. All of the phase differences each between the four-phase clock signals CK31 to CK34 are the same 90°. The frequency division correction circuit in this embodiment can generate the four-phase clock signals CK31 to CK34 having each of the phase differences which are the same even using the decimal frequency divider 302.

Figure 4:
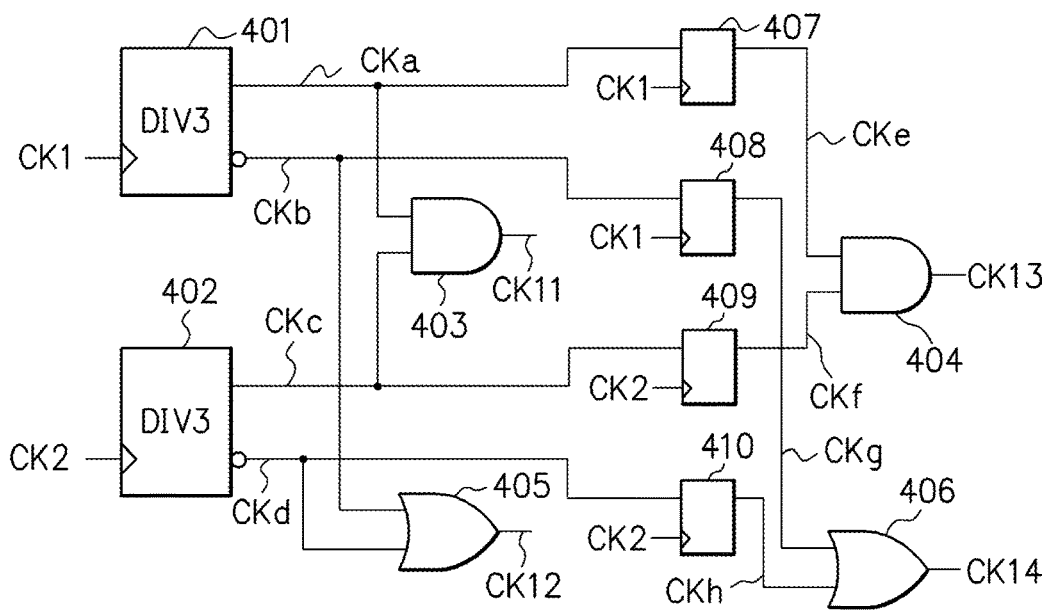
FIG. 4 is a diagram illustrating a configuration example of a divide-by-1.5 divider.
Figure 5:
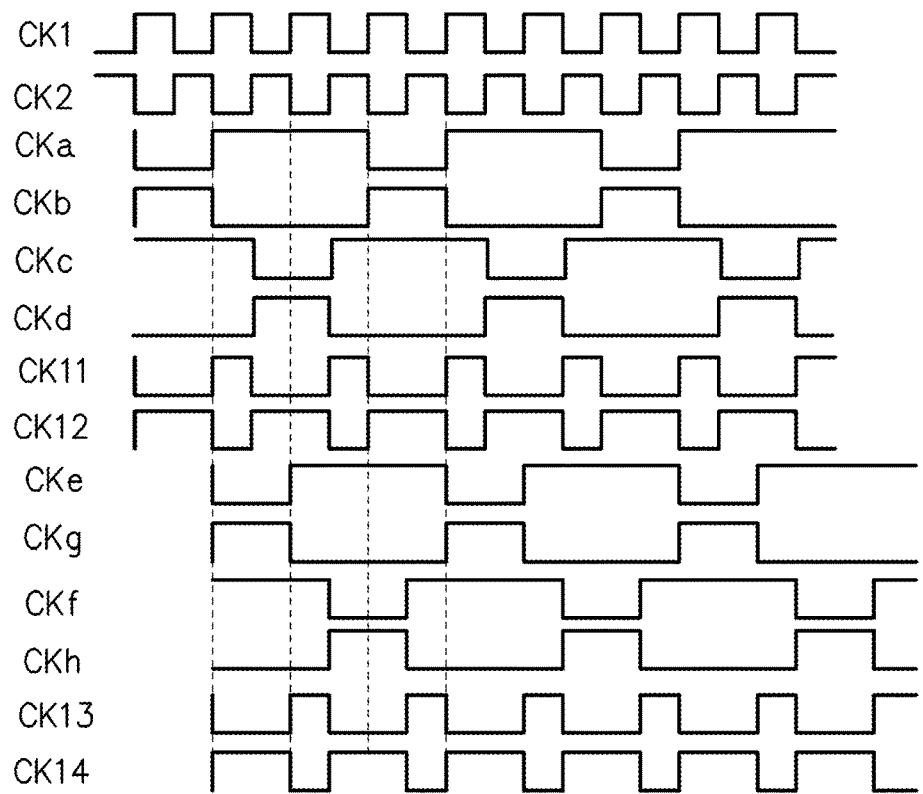
FIG. 5 is a timing chart illustrating the operation of the divide-by-1.5 divider.

FIG. 4 is a diagram illustrating a configuration example of the divide-by-1.5 divider 302, and FIG. 5 is a timing chart illustrating the operation of the divide-by-1.5 divider 302. A divide-by-3 divider 401 receives input of a clock signal CK1 and outputs divide-by-3 divided clock signals CKa and CKb. The cycle of each of the clock signals CKa and CKb is three times the cycle of the clock signal CK1. The clock signals CKa and CKb are signals which are logically inverted from each other. The duty ratio of the clock signal CKa is 66.67%, and the duty ratio of the clock signal CKb is 33.33%.

A divide-by-3 divider 402 receives input of a clock signal CK2 and outputs divide-by-3 divided clock signals CKc and CKd. The cycle of each of the clock signals CKc and CKd is three times the cycle of the clock signal CK2. The clock signals CKc and CKd are signals which are logically inverted from each other. The duty ratio of the clock signal CKc is 66.67%, and the duty ratio of the clock signal CKd is 33.33%.

A flip-flop 407 synchronizes with the clock signal CK1 and outputs a clock signal CKe made by delaying the clock signal CKa by one clock. A flip-flop 408 synchronizes with the clock signal CK1 and outputs a clock signal CKg made by delaying the clock signal CKb by one clock. A flip-flop 409 synchronizes with the clock signal CK2 and outputs a clock signal CKf made by delaying the clock signal CKc by one clock. A flip-flop 410 synchronizes with the clock signal CK2 and outputs a clock signal CKh made by delaying the clock signal CKd by one clock.

A logical product (AND) circuit 403 outputs a logical product signal of the clock signals CKa and CKc as the clock signal CK11. A logical sum (OR) circuit 405 outputs a logical sum signal of the clock signals CKb and CKd as the clock signal CK12. A logical product circuit 404 outputs a logical product signal of the clock signals CKe and CKf as the clock signal CK13. A logical sum circuit 406 outputs a logical sum signal of the clock signals CKg and CKh as the clock signal CK14.

FIG. 6A is a diagram illustrating a first configuration example of the duty cycle corrector 303, and FIG. 6B is a timing chart illustrating the operation of the duty cycle corrector 303 in FIG. 6A. A p-channel field-effect transistor 601 has a gate connected to a node of the clock signal CK11, a source connected to a node of a power supply potential (second potential) Vdd, and a drain connected to a node of the clock signal CK21. An n-channel field-effect transistor 602 has a gate connected to a node of the clock signal CK14, a source connected to a node of the ground potential (first potential), and a drain connected to the node of the clock signal CK21. When the clock signals CK11 and CK14 are at a high level, the p-channel field-effect transistor 601 is turned off and the n-channel field-effect transistor 602 is turned on so that the clock signal CK21 becomes the ground potential (low level). Besides, when the clock signals CK11 and CK14 are at a low level, the p-channel field-effect transistor 601 is turned on and the n-channel field-effect transistor 602 is turned off so that the clock signal CK21 becomes the power supply potential (high level) Vdd. Besides, when the clock signal CK11 is at a low level and the clock signal CK14 is at a high level, the p-channel field-effect transistor 601 and the n-channel field-effect transistor 602 are turned on so that the clock signal CK21 becomes an intermediate potential (intermediate level) Vdd/2. The clock signal CK21 in FIG. 6B is different from the clock signal CK21 in FIG. 3B. The divide-by-2 divider 304 in FIG. 3A cannot generate the four-phase clock signals CK31 to CK34 which are deviated by 90° each in phase difference even using the clock signal CK21 in FIG. 6B.

Figure 7A:
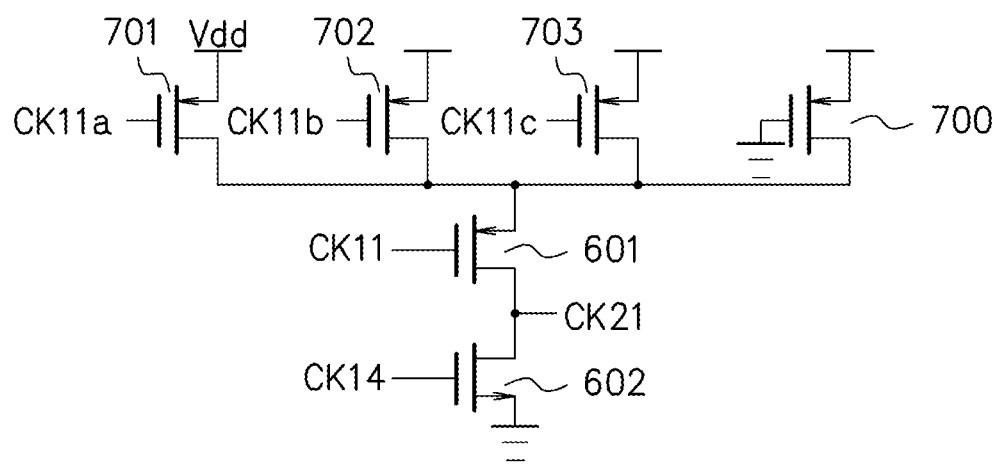
FIG. 7A is a diagram illustrating a second configuration example of the duty cycle corrector.
Figure 7B:
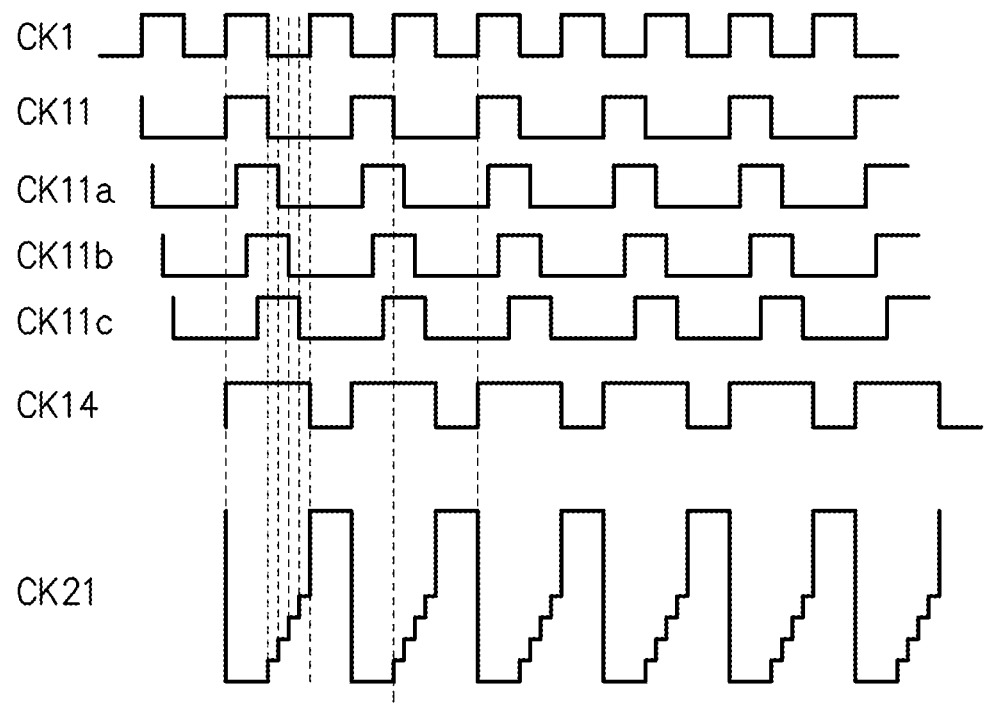
FIG. 7B is a timing chart illustrating the operation of the duty cycle corrector in FIG. 7A.

FIG. 7A is a diagram illustrating a second configuration example of the duty cycle corrector 303, and FIG. 7B is a timing chart illustrating the operation of the duty cycle corrector 303 in FIG. 7A. The duty cycle corrector 303 in FIG. 7A is made by adding p-channel field-effect transistors 700 to 703 to the duty cycle corrector 303 in FIG. 6A. Delay signals CK11a to CK11c are delay signals different in delay time from one another with respect to the clock signal CK11. The p-channel field-effect transistor 700 has a gate connected to the node of the ground potential, a source connected to the node of the power supply potential Vdd, and a drain connected to a source of the p-channel field-effect transistor 601. The p-channel field-effect transistor 701 has a gate connected to a node of the delay signal CK11a, a source connected to the node of the power supply potential Vdd, and a drain connected to the source of the p-channel field-effect transistor 601. The p-channel field-effect transistor 702 has a gate connected to a node of the delay signal CK11b, a source connected to the node of the power supply potential Vdd, and a drain connected to the source of the p-channel field-effect transistor 601. The p-channel field-effect transistor 703 has a gate connected to a node of the delay signal CK11c, a source connected to the node of the power supply potential Vdd, and a drain connected to the source of the p-channel field-effect transistor 601.

When the clock signals CK11 and CK14 are at a high level, the p-channel field-effect transistor 601 is turned off and the n-channel field-effect transistor 602 is turned on so that the clock signal CK21 becomes the ground potential (low level). Immediately before the clock signal CK11 falls, the delay signals CK11a to CK11c are at a high level and the p-channel field-effect transistors 701 to 703 are off.

Then, when the clock signal CK11 becomes a low level, the p-channel field-effect transistors 601 and 700 are turned on so that the potential of the clock signal CK21 slightly rises. Then, when the delay signal CK11a becomes a low level, the p-channel field-effect transistor 701 is turned on so that the potential of the clock signal CK21 further slightly rises. Then, when the delay signal CK11b becomes a low level, the p-channel field-effect transistor 702 is turned on so that the potential of the clock signal CK21 further slightly rises. Then, when the delay signal CK11c becomes a low level, the p-channel field-effect transistor 703 is turned on so that the potential of the clock signal CK21 further slightly rises and becomes the intermediate potential Vdd/2. Thereafter, when the clock signal CK14 becomes a low level, the n-channel field-effect transistor 602 is turned off so that the clock signal CK21 becomes the power supply potential (high level) Vdd.

The clock signal CK21 in FIG. 7B is closer to the clock signal CK21 in FIG. 3B than to the clock signal CK21 in FIG. 6B, but is different from the clock signal CK21 in FIG. 3B. The divide-by-2 divider 304 in FIG. 3A cannot generate the four-phase clock signals CK31 to CK34 which are deviated by 90° each in phase difference even using the clock signal CK21 in FIG. 7B.

Figure 8A:
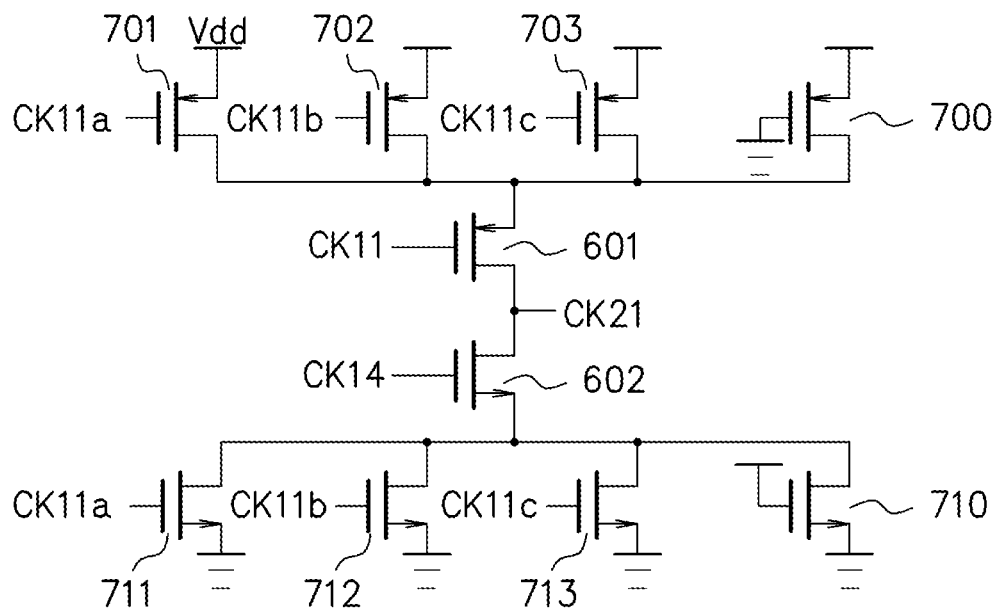
FIG. 8A is a diagram illustrating a configuration example of a part of the duty cycle corrector according to this embodiment.
Figure 8B:
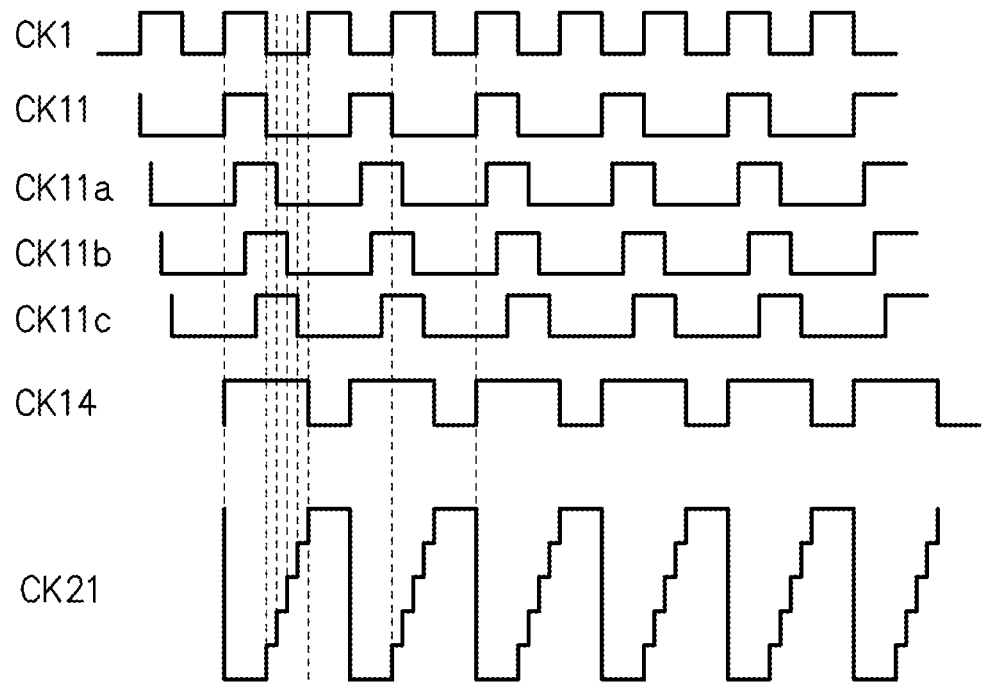
FIG. 8B is a timing chart illustrating the operation of the duty cycle corrector in FIG. 8A.

FIG. 8A is a diagram illustrating a configuration example of a part of the duty cycle corrector 303 according to this embodiment, and FIG. 8B is a timing chart illustrating the operation of the duty cycle corrector 303 in FIG. 8A. The duty cycle corrector 303 in FIG. 8A is made by adding n-channel field-effect transistors 710 to 713 to the duty cycle corrector 303 in FIG. 7A. Delay signals CK11a to CK11c are delay signals different in delay time from one another with respect to the clock signal CK11.

A first p-channel field-effect transistor 601 has a gate connected to a node of the clock signal CK11, and a drain connected to a node of the clock signal CK21. A first n-channel field-effect transistor 602 has a gate connected to a node of the clock signal CK14, and a drain connected to the node of the clock signal CK21.

A second p-channel field-effect transistor 700 has a gate connected to a node of the ground potential (first potential), a source connected to a node of the power supply potential (second potential) Vdd, and a drain connected to a source of the first p-channel field-effect transistor 601. A third p-channel field-effect transistor 701 has a gate connected to a node of the delay signal CK11a, a source connected to the node of the power supply potential Vdd, and a drain connected to the source of the first p-channel field-effect transistor 601. A fourth p-channel field-effect transistor 702 has a gate connected to a node of the delay signal CK11b, a source connected to the node of the power supply potential Vdd, and a drain connected to the source of the first p-channel field-effect transistor 601. A fifth p-channel field-effect transistor 703 has a gate connected to a node of the delay signal CK11c, a source connected to the node of the power supply potential Vdd, and a drain connected to the source of the first p-channel field-effect transistor 601.

The second n-channel field-effect transistor 710 has a gate connected to the node of the power supply potential Vdd, a source connected to the node of the ground potential, and a drain connected to a source of the first n-channel field-effect transistor 602. The third n-channel field-effect transistor 711 has a gate connected to the node of the delay signal CK11a, a source connected to the node of the ground potential, and a drain connected to the source of the first n-channel field-effect transistor 602. The fourth n-channel field-effect transistor 712 has a gate connected to the node of the delay signal CK11b, a source connected to the node of the ground potential, and a drain connected to the source of the first n-channel field-effect transistor 602. The fifth n-channel field-effect transistor 713 has a gate connected to the node of the delay signal CK11c, a source connected to the node of the ground potential, and a drain connected to the source of the first n-channel field-effect transistor 602.

When the clock signals CK11 and CK14 are at a high level, the p-channel field-effect transistor 601 is turned off and the n-channel field-effect transistors 602 and 701 are turned on so that the clock signal CK21 becomes the ground potential (low level). Immediately before the clock signal CK11 falls, the delay signals CK11a to CK11c are at a high level, the p-channel field-effect transistors 701 to 703 are off, and the n-channel field-effect transistors 711 to 713 are on.

Then, when the clock signal CK11 becomes a low level, the p-channel field-effect transistors 601 and 700 are turned on so that the potential of the clock signal CK21 slightly rises. Then, when the delay signal CK11a becomes a low level, the p-channel field-effect transistor 701 is turned on and the n-channel field-effect transistor 711 is turned off so that the potential of the clock signal CK21 further slightly rises. Then, when the delay signal CK11b becomes a low level, the p-channel field-effect transistor 702 is turned on and the n-channel field-effect transistor 712 is turned off so that the potential of the clock signal CK21 further slightly rises. Then, when the delay signal CK11c becomes a low level, the p-channel field-effect transistor 703 is turned on and the n-channel field-effect transistor 713 is turned off so that the potential of the clock signal CK21 further slightly rises and becomes higher than the intermediate potential Vdd/2. Thereafter, when the clock signal CK14 becomes a low level, the n-channel field-effect transistor 602 is turned off so that the clock signal CK21 becomes the power supply potential (high level) Vdd.

The clock signal CK21 in FIG. 8B is substantially the same as the clock signal CK21 in FIG. 3B. The divide-by-2 divider 304 in FIG. 3A can generate the four-phase clock signals CK31 to CK34 which are deviated by 90° each in phase difference by using the clock signal CK21 in FIG. 8B.

FIG. 9A to FIG. 9D are diagrams illustrating configuration examples of the duty cycle corrector 303 according to this embodiment. The duty cycle corrector 303 has a first output circuit in FIG. 9A, a second output circuit in FIG. 9B, and delay circuits in FIG. 9C and FIG. 9D. As illustrated in FIG. 9C and FIG. 9D, the delay circuits have inverters 931 to 933 and 941 to 943, respectively. The clock signals CK11 and CK12 are signals which are logically inverted from each other as illustrated in FIG. 5.

The first inverter 931 receives input of the clock signal CK11 and outputs a delay signal CK12a made by logically inverting the clock signal CK11. The delay signal CK12a corresponds to a signal made by delaying the clock signal CK12. The second inverter 941 receives input of the clock signal CK12 and outputs a delay signal CK11a made by logically inverting the clock signal CK12. The delay signal CK11a corresponds to a signal made by delaying the clock signal CK11.

The third inverter 932 receives input of the delay signal CK12a outputted from the first inverter 931, and outputs a delay signal CK11b made by logically inverting the delay signal CK12a. The delay signal CK11b corresponds to a signal made by delaying the delay signal CK11a. The fourth inverter 942 receives input of the delay signal CK11a outputted from the second inverter 941, and outputs a delay signal CK12b made by logically inverting the delay signal CK11a. The delay signal CK12b corresponds to a signal made by delaying the delay signal CK12a.

The fifth inverter 933 receives input of the delay signal CK11b outputted from the third inverter 932, and outputs a delay signal CK12c made by logically inverting the delay signal CK11b. The delay signal CK12c corresponds to a signal made by delaying the delay signal CK12b. The sixth inverter 943 receives input of the delay signal CK12b outputted from the fourth inverter 942, and outputs a delay signal CK11c made by logically inverting the delay signal CK12b. The delay signal CK11c corresponds to a signal made by delaying the delay signal CK11b.

As described above, the delay circuits in FIG. 9C and FIG. 9D generate the first delay signal CK11a, the second delay signal CK11b, and the third delay signal CK11c which are different in delay time from one another with respect to the clock signal CK11. The delay circuits in FIG. 9C and FIG. 9D also generate the fourth delay signal CK12a, the fifth delay signal CK12b, and the sixth delay signal CK12c which are different in delay time from one another with respect to the clock signal CK12.

The first output circuit in FIG. 9A has the same configuration as that in FIG. 8A, and outputs the clock signal CK21 based on the clock signal CK11, the clock signal CK14, and the delay signals CK11a, CK11b, CK11c.

The second output circuit in FIG. 9B outputs a clock signal CK22 based on the clock signal CK13, the clock signal CK12, and the delay signals CK12a, CK12b, CK12c. Hereinafter, the configuration of the second output circuit in FIG. 9B will be described.

A sixth p-channel field-effect transistor 921 has a gate connected to a node of the clock signal CK13, and a drain connected to a node of the clock signal CK22. A sixth n-channel field-effect transistor 922 has a gate connected to a node of the clock signal CK12, and a drain connected to the node of the clock signal CK22.

A seventh p-channel field-effect transistor 900 has a gate connected to a node of the ground potential, a source connected to a node of the power supply potential Vdd, and a drain connected to a source of the sixth p-channel field-effect transistor 921. An eighth p-channel field-effect transistor 901 has a gate connected to a node of the delay signal CK12a, a source connected to the node of the power supply potential Vdd, and a drain connected to the source of the sixth p-channel field-effect transistor 921. A ninth p-channel field-effect transistor 902 has a gate connected to a node of the delay signal CK12b, a source connected to the node of the power supply potential Vdd, and a drain connected to the source of the sixth p-channel field-effect transistor 921. A tenth p-channel field-effect transistor 903 has a gate connected to a node of the delay signal CK12c, a source connected to the node of the power supply potential Vdd, and a drain connected to the source of the sixth p-channel field-effect transistor 921.

A seventh n-channel field-effect transistor 910 has a gate connected to the node of the power supply potential Vdd, a source connected to the node of the ground potential, and a drain connected to a source of the sixth n-channel field-effect transistor 922. An eighth n-channel field-effect transistor 911 has a gate connected to the node of the delay signal CK12a, a source connected to the node of the ground potential, and a drain connected to the source of the sixth n-channel field-effect transistor 922. A ninth n-channel field-effect transistor 912 has a gate connected to the node of the delay signal CK12b, a source connected to the node of the ground potential, and a drain connected to the source of the sixth n-channel field-effect transistor 922. A tenth n-channel field-effect transistor 913 has a gate connected to the node of the delay signal CK12c, a source connected to the node of the ground potential, and a drain connected to the source of the sixth n-channel field-effect transistor 922.

As with the timing chart in FIG. 8B, the second output circuit in FIG. 9B can generate the clock signal CK22 based on the clock signals CK13 and CK12 as illustrated in FIG. 3B. The clock signal CK22 is a signal made by inverting the clock signal CK21. The cycle of each of the clock signals CK21 and CK22 is one-and-a-half times the cycle of each of the clock signals CK1 and CK2. The duty ratio of each of the clock signals CK21 and CK22 is 50%. The divide-by-2 divider 304 in FIG. 3A can generate the four-phase clock signals CK31 to CK34 which are deviated by 90° each in phase difference, by frequency-dividing the clock signals CK21 and CK22 in FIG. 3B by 2.

Figure 10:
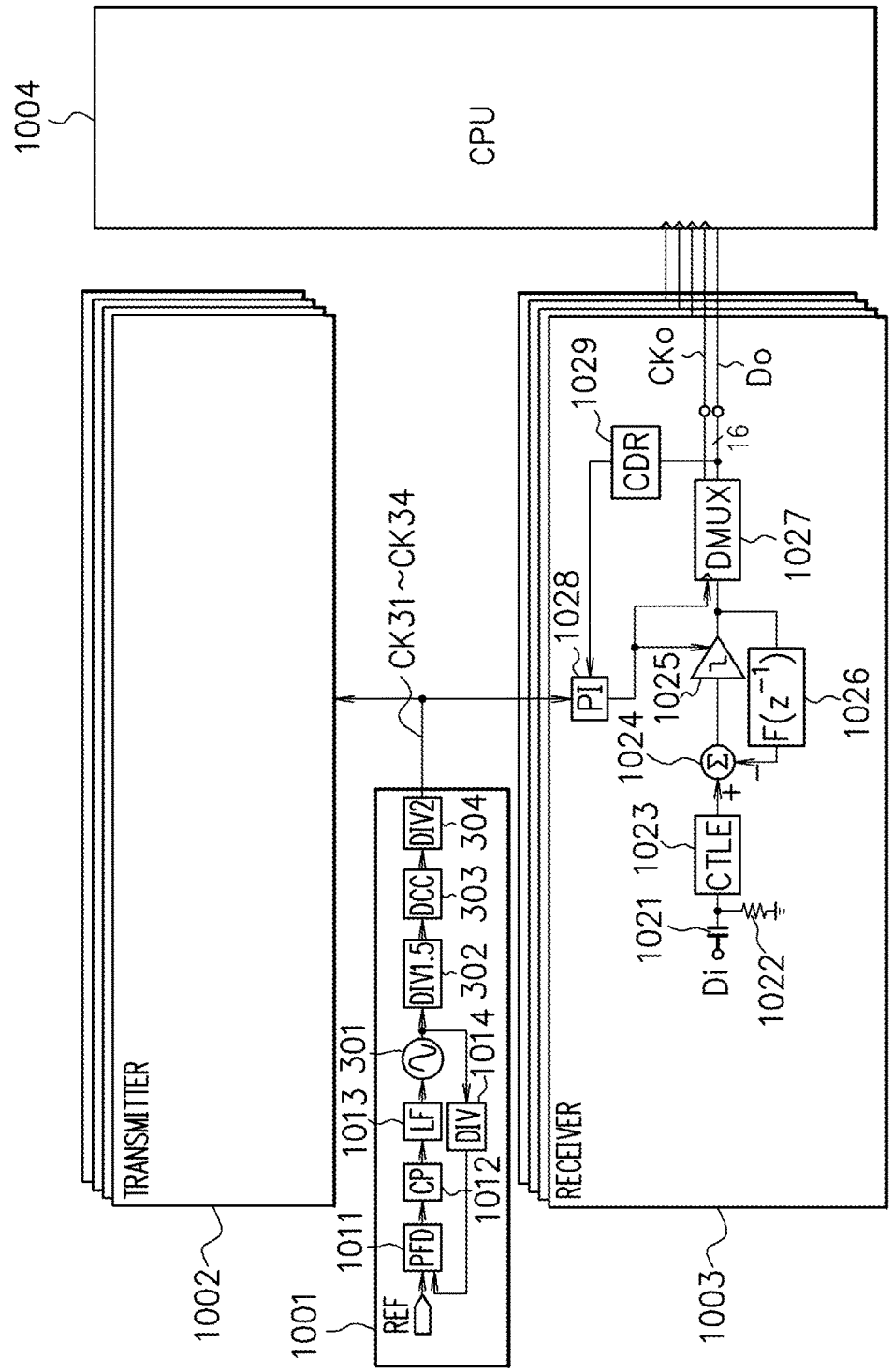
FIG. 10 is a diagram illustrating a configuration example of an integrated circuit according to this embodiment.

FIG. 10 is a diagram illustrating a configuration example of an integrated circuit according to this embodiment. The integrated circuit has a phase locked-loop (PLL) circuit 1001, a transmitter 1002, a receiver 1003, and a central processing unit (CPU) 1004. A reception circuit has the phase locked-loop circuit 1001 and the receiver 1003. The phase locked-loop circuit 1001 has the frequency division correction circuit including the voltage control oscillator 301, the divide-by-1.5 divider 302, the duty cycle corrector 303, and the divide-by-2 divider 304 in FIG. 3A. The phase locked-loop circuit 1001 further has a phase-frequency detector (PFD) 1011, a charge pump (CP) 1012, a low-pass filter (LF) 1013, and a frequency divider 1014. The phase-frequency detector 1011 compares phases of the clock signal outputted from the frequency divider 1014 and a reference clock signal REF, and outputs an up-signal or a down-signal to the charge pump 1012. The charge pump 1012 raises the output voltage by the up-signal and lowers the output voltage by the down-signal. The low-pass filter 1013 performs low-pass filtering on the output voltage from the charge pump 1012, and outputs a control voltage to the voltage control oscillator 301. The voltage control oscillator 301 outputs the clock signals CK1 and CK2 having a frequency according to the control voltage. The frequency divider 1014 frequency-divides the clock signal CK1 and outputs a frequency division signal to the phase-frequency detector 1011. Description of the voltage control oscillator 301, the divide-by-1.5 divider 302, the duty cycle corrector 303, and the divide-by-2 divider 304 is the same as for FIG. 3A. The phase locked-loop circuit 1001 outputs the four-phase clock signals CK31 to CK34 in synchronism with the reference clock REF to the transmitter 1002 and the receiver 1003.

The receiver 1003 receives serial data Di and outputs parallel data Do and a clock signal CKo to the central processing unit 1004, based on the four-phase clock signals CK31 to CK34. Hereinafter, the operation of the receiver 1003 will be described. A phase interpolator (PI) 1028 weights the four-phase clock signals CK31 to CK34, and outputs a clock signal in a phase according to a phase code outputted from a clock data recovery (CDR) circuit 1029, to a determiner 1025 and a demultiplexer 1027. The serial data Di is inputted into a continuous time linear equalizer (CTLE) 1023 via a capacitor 1021. A resistor 1022 is connected between an input terminal of the continuous time linear equalizer 1023 and a ground potential node. The continuous time linear equalizer 1023 performs equalization processing on the serial data Di to compensate for a signal distortion due to transmission path characteristics. A subtracter 1024 subtracts an intersymbol interference component outputted from a circuit 1026 from the output signal from the continuous time linear equalizer 1023 to thereby remove the intersymbol interference component. The determiner 1025 performs, in synchronism with the clock signal outputted from the phase interpolator 1026, binary determination on the output data from the subtracter 1024. The circuit 1026 outputs the intersymbol interference component for next data to the subtracter 1024, based on the determination result by the determiner 1025. The demultiplexer 1027 converts, in synchronism with the clock signal outputted from the phase interpolator 1028, the serial data outputted from the determiner 1025 to 16-bit parallel data Do. The CDR circuit 1029 detects transition timing (boundary timing) of data, based on the 16-bit parallel data Do, and outputs a phase code according to the transition timing to the phase interpolator 1028. The receiver 1003 outputs the parallel data Do and a clock signal CKo to the central processing unit 1004. The clock signal CKo is a clock signal corresponding to the parallel data Do.

The central processing unit 1004 is a processing unit and processes the parallel data Do using the clock signal CKo. The central processing unit 1004 also outputs transmission data to the transmitter 1002. The transmitter 1002 receives input of the four-phase clock signals CK31 to CK34 outputted from the phase locked-loop circuit 1001, converts the transmission data outputted from the central processing unit 1004 from parallel to serial, and transmits serial data.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

In one aspect, it is possible to generate a decimal-frequency division signal having a duty ratio of 50% without using four-phase clocks.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A frequency division correction circuit comprising:
   a first frequency divider configured to perform non-integer frequency division on an input signal and output a first frequency division signal and a second frequency division signal which are different from each other in duty ratio; and
   a corrector configured to generate a first output signal having an intermediate duty ratio between a duty ratio of the first frequency division signal and a duty ratio of the second frequency division signal on the basis of the first frequency division signal and the second frequency division signal, wherein:
   the first frequency divider is configured to output a third frequency division, signal that is a logical inversion signal of the first frequency division signal and a fourth frequency division signal that is a logical inversion signal of the second frequency division signal; and
   the corrector is configured to generate a second output signal having an intermediate duty ratio between a duty ratio of the third frequency division signal and a duty ratio of the fourth frequency division signal, based on the third frequency division signal and the fourth frequency division signal.

2. The frequency division correction circuit according to claim 1, wherein
   the corrector is configured to generate the first output signal so that a level of the first output signal is changed from a first logical level toward a second logical level in a level change time longer than a level change time of each of the first frequency division signal and the second frequency division signal.

3. The frequency division correction circuit according to claim 1, wherein
   the corrector includes:
   a delay circuit configured to generate a delay signal of the first frequency division signal; and
   an output circuit configured to output the first output signal on the basis of the first frequency division signal, the second frequency division signal, and the delay signal of the first frequency division signal.

4. The frequency division correction circuit according to claim 3, wherein
   the output circuit includes:
   a first p-channel field-effect transistor having a gate connected to a node of the first frequency division signal, and a drain connected to a node of the first output signal;
   a first n-channel field-effect transistor having a gate connected to a node of the second frequency division signal, and a drain connected to a node of the first output signal;
   a second p-channel field-effect transistor having a gate connected to a node of a first potential, a source connected to a node of a second potential, and a drain connected to a source of the first p-channel field-effect transistor;
   a third p-channel field-effect transistor having a gate connected to a node of the delay signal of the first frequency division signal, a source connected to the node of the second potential, and a drain connected to the source of the first p-channel field-effect transistor;
   a second n-channel field-effect transistor having a gate connected to the node of the second potential, a source connected to the node of the first potential, and a drain connected to a source of the first n-channel field-effect transistor; and
   a third n-channel field-effect transistor having a gate connected to the node of the delay signal of the first frequency division signal, a source connected to the node of the first potential, and a drain connected to the source of the first n-channel field-effect transistor.

5. The frequency division correction circuit according to claim 4, wherein:
   the delay circuit is configured to generate a first delay signal, a second delay signal, and a third, delay signal which are different in delay time from one another with respect to the first frequency division signal;
   the gate of the third p-channel field-effect transistor is connected to a node of the first delay signal;
   the gate of the third n-channel field-effect transistor is connected to the node of the first delay signal; and
   the output circuit includes:
   a fourth p-channel field-effect transistor having a gate connected to a node of the second delay signal, a source connected to the node of the second potential, and a drain connected to the source of the first p-channel field-effect transistor;
   a fifth p-channel field-effect transistor having a gate connected to a node of the third delay signal, a source connected to the node of the second potential, and a drain connected to the source of the first p-channel field-effect transistor;
   a fourth n-channel field-effect transistor having a gate connected to the second delay signal, a source connected to the node of the first potential, and a drain connected to the source of the first n-channel field-effect transistor; and
   a fifth n-channel field-effect transistor having a gate connected to the node of the third delay signal, a source connected to the node of the first potential, and a drain connected to the source of the first n-channel field-effect transistor.

6. The frequency division correction circuit according to claim 1, wherein
   the corrector includes:
   a delay circuit configured to generate a delay signal of the first frequency division signal and a delay signal of the third frequency division signal;
   a first output circuit configured to output the first output signal on the basis of the first frequency division signal, the second frequency division signal, and the delay signal of the first frequency division signal; and
   a second output circuit configured to output the second output signal on the basis of the third frequency division signal, the fourth frequency division signal, and the delay signal of the third frequency division signal.

7. The frequency division correction circuit according to claim 6, wherein:
   the first output circuit includes:
   a first p-channel field-effect transistor having a gate connected to a node of the first frequency division signal, and a drain connected to a node of the first output signal;

a first n-channel field-effect transistor having a gate connected to a node of the second frequency division signal, and a drain connected to a node of the first output signal;

a second p-channel field-effect transistor having a gate connected to a node of a first potential, a source connected to a node of a second potential, and a drain connected to a source of the first p-channel field-effect transistor;

a third p-channel field-effect transistor having a gate connected to a node of the delay signal of the first frequency division signal, a source connected to the node of the second potential, and a drain connected to the source of the first p-channel field-effect transistor;

a second n-channel field-effect transistor having a gate connected to the node of the second potential, a source connected to the node of the first potential, and a drain connected to a source of the first n-channel field-effect transistor; and a third n-channel field-effect transistor having a gate connected to the node of the delay signal of the first frequency division signal, a source connected to the node of the first potential, and a drain connected to the source of the first n-channel field-effect transistor; and the second output circuit comprises:

a sixth p-channel field-effect transistor having a gate connected to a node of the fourth frequency division signal, and a drain connected to a node of the second output signal;

a sixth n-channel field-effect transistor having a gate connected to a node of the third frequency division signal, and a drain connected to the node of the second output signal;

a seventh p-channel field-effect transistor having a gate connected to the node of the first potential, a source connected to the node of the second potential, and a drain connected to a source of the sixth p-channel field-effect transistor;

an eighth p-channel field-effect transistor having a gate connected to a node of the delay signal of the third frequency division signal, a source connected to the node of the second potential, and a drain connected to the source of the sixth p-channel field-effect transistor;

a seventh n-channel field-effect transistor having a gate connected to the node of the second potential, a source connected to the node of the first potential, and a drain connected to a source of the sixth n-channel field-effect transistor; and an eighth n-channel field-effect transistor having a gate connected to node of the delay signal of the third frequency division signal, a source connected to the node of the first potential, and a drain connected to the source of the sixth n-channel field-effect transistor.

8. The frequency division correction circuit according to claim 7, wherein:

the delay circuit includes:

a first inverter configured to logically invert the first frequency division signal; and a second inverter configured to logically invert the third frequency division signal;

the gate of the third p-channel field-effect transistor is connected to a node of an output signal from the second inverter;

the gate of the third n-channel field-effect transistor is connected to the node of the output signal from the second inverter;

the gate of the eighth p-channel field-effect transistor is connected to a node of an output signal from the first inverter; and the gate of the eighth n-channel field-effect transistor is connected to the node of the output signal from the first inverter.

9. The frequency division correction circuit according to claim 1, further comprising:

a second frequency divider configured to perform integer frequency division on the first output signal.

10. A reception circuit comprising:

a frequency division correction circuit configured to generate a first output signal; and a receiver configured to receive data, based on the first output signal, wherein the frequency division correction circuit includes:

a first frequency divider configured to perform non-integer frequency division on an input signal and output a first frequency division signal and a second frequency division signal which are different from each other in duty ratio; and a corrector configured to generate a first output signal having an intermediate duty ratio between a duty ratio of the first frequency division signal and a duty ratio of the second frequency division signal on the basis of the first frequency division signal and the second frequency division signal, wherein:

the first frequency divider is configured to output a third frequency division signal that is a logical inversion signal of the first frequency division signal and a fourth frequency division signal that is a logical inversion signal of the second frequency division signal; and the corrector is configured to generate a second output signal having an intermediate duty ratio between a duty ratio of the third frequency division signal and a duty ratio of the fourth frequency division signal, frequency division signal and the fourth frequency division signal.

11. The reception circuit according to claim 10, wherein the corrector is configured to generate the first output signal so that a level of the first output signal is changed from a first logical level toward a second logical level in a level change time longer than a level change time of each of the first frequency division signal and the second frequency division signal.

12. The reception circuit according to claim 10, wherein the corrector includes:

a delay circuit configured to generate a delay signal of the first frequency division signal; and an output circuit configured to output the first output signal on the basis of the first frequency division signal, the second frequency division, signal, and the delay signal of the first frequency division signal.

13. The reception circuit according to claim 10, wherein the corrector includes:

a delay circuit configured to generate a delay signal of the first frequency division signal and a delay signal of the third frequency division signal;

a first output circuit configured to output the first output signal on the basis of the first frequency division signal, the second frequency division signal, and the delay signal of the first frequency division signal; and a second output circuit configured to output the second output signal on the basis of the third frequency division signal, the fourth frequency division signal, and the delay signal of the third frequency division signal.

14. An integrated circuit comprising:
a frequency division correction circuit configured to generate a first output signal;
a receiver configured to receive data, based on the first output signal; and
processing unit configured to process the data received by the receiver, wherein
the frequency division correction circuit includes:
  a first frequency divider configured to perform non-integer frequency division on an input signal and output a first frequency division signal and a second frequency division signal which are different from each other in duty ratio; and
  a corrector configured to generate a first output signal having an intermediate duty ratio between a duty ratio of the first frequency division signal and a duty ratio of the second frequency division signal on the basis of the first frequency division signal and the second frequency division signal, wherein:
  the first frequency divider is configured to output a third frequency division signal that is a logical inversion signal of the first frequency division signal and a fourth frequency division signal that is a logical inversion signal of the second frequency division signal; and
  the corrector is configured to generate a second output signal having an intermediate duty ratio between a duty ratio of the third frequency division signal and a duty ratio of the fourth frequency division signal, based on the third frequency division signal and the fourth frequency division signal.

15. The integrated circuit according to claim 14, wherein the corrector is configured to generate the first output signal so that a level of the first output signal is changed from a first logical level toward a second logical level in a level change time longer than a level change time of each of the first frequency division signal and the second frequency division signal.

16. The integrated circuit according to claim 14, wherein the corrector includes:
a delay circuit configured to generate a delay signal of the first frequency division signal; and
an output circuit configured to output the first output signal on the basis of the first frequency division signal, the second frequency division signal, and the delay signal of the first frequency division signal.

17. The integrated circuit according to claim 14, wherein the corrector includes:
a delay circuit configured to generate a delay signal of the first frequency division signal and a delay signal of the third frequency division signal;
a first output circuit configured to output the first output signal on the basis of the first frequency division signal, the second frequency division signal, and the delay signal of the first frequency division signal; and
a second output circuit configured to output the second output signal on the basis of the third frequency division signal, the fourth frequency division signal, and the delay signal of the third frequency division signal.

* * * * *